(12) United States Patent
Goodelle et al.

(10) Patent No.: US 6,894,400 B1
(45) Date of Patent: May 17, 2005

(54) ROBUST ELECTRONIC DEVICE PACKAGES

(75) Inventors: Jason P. Goodelle, Kutztown, PA (US); John W. Osenbach, Kutztown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/853,395

(22) Filed: May 25, 2004

(51) Int. Cl.[7] .................. H01L 23/22; H01L 23/24; H01L 23/02; H01L 23/48; H01L 23/29
(52) U.S. Cl. ............... 257/795; 257/789; 257/687; 257/678
(58) Field of Search ................... 257/678, 687, 257/737, 777–778, 787–795

(56) References Cited

U.S. PATENT DOCUMENTS 5,953,814 A * 9/1999 Sozansky et al. ........... 438/108
6,521,480 B1 * 2/2003 Mitchell et al. ............ 438/108

OTHER PUBLICATIONS

Harper, Charles Ed. "Materials for Electronic Packaging" in Elect. Pack. & Interconnect Hdbk, NY :McGraw–Hill, 2000, 6–14, 41–42, 44–46.
Product Data Sheet for ShinEtsu 5125 Nov. 1998.
Product Data Sheet for Sumitomo 4152–R5 Jun. 2002.
Product Data Sheet for Nagase 3423iHX–5 Mar. 2003.
Product Data Sheet for Loctite FP4549 Nov. 2002.
Product Data Sheet for NAMICS U8439–1.
Product Data Sheet for Abelstik RP658–7C.

* cited by examiner

*Primary Examiner*—Cuong Nguyen

(57) ABSTRACT

Packages for electronic devices are formed from a die such as a silicon die in electrical communication with a substrate through a mating array, e.g. ball array, on the substrate. An underfill material is present between the die and substrate in the region of the array. For large dies (a dimension of 15 mm or greater) failure of the connection between the die and substrate is avoided by employing a particle filled underfill material with specifically chosen Young moduli both below and above the glass transition temperature of the underfill material.

20 Claims, 1 Drawing Sheet

ROBUST ELECTRONIC DEVICE PACKAGES

TECHNICAL FIELD

This invention relates to electronic devices and in particular electronic devices that are robust.

BACKGROUND OF THE INVENTION

In the packaging of electronic devices and in particular of integrated circuits, the number of leads required for electrical communication with the device has grown substantially. At one time, leads exiting a device package were provided by a lead frame. As shown in FIG. 1, pads on the silicon chip (commonly called a die) were bonded to leads, 3, that ultimately protruded from the device package using thin wires between the pad and the package lead. These wires, 4, were attached to the pad and lead respectively by ultrasonic ball and wedge bonds. The geometry of such a packaging approach and the wire connection required, severely limits the number of external leads available and increases both the complexity and difficulty of the packaging approach, in general.

To improve on the lead frame configuration, solder bump flip chip approaches have been implemented. The silicon die has electrical contacts provided by solder balls attached generally in a regular array to one major surface of the die. Thus as shown in the plan view (not to scale) of a die (FIG. 2), the solder balls or bumps (generally denominated a ball grid array) are arranged in a regular matrix configuration. This array is then mated with a complementary array on a package substrate. On one side of the package substrate is a solder pad array whose surfaces align with the bumps of the die to which contact is desired. The opposing major surface of the substrate similarly has a solder ball array generally of a lower density than that of the array mating with the die. For example, typical high density arrays on the die are 100×100 arrays while substrate arrays for external connection on the opposing side of the substrate are typically 45×45 configurations. The interconnect between the more dense array mating with the die and the less dense array for external connection is produced generally by using multi-levels (often up to eight) of metal runner interconnects formed in the substrate much like the multi-level interconnects on the IC device itself except typically using a design rule on the order of 200 $\mu$m. The use of solder bumps substantially reduces the capacitance and inductance usually associated with the wire bond approach, significantly speeds the packaging process, and provides a much larger array of external interconnections to the internal die.

Although solder bump flip chip technology offers many advantages, the difference in the material of the die (e.g. a silicon based structure) and the material of the package substrate (e.g. a polymer based structure) presents challenges. One substantial problem results from the difference in the coefficient of thermal expansion between the die and the substrate. Generally, for common, high density devices presently available, it is not unusual that operating temperatures between 80 to 90° C. and in some cases 110 to 120° C. are produced. Since the coefficient of thermal expansion for silicon is two to three ppm/° C. and that for typical plastic substrates is 15 to 23 ppm/° C., during operation the substrate dimensions change significantly relative to that of the die. The mating solder bumps between the substrate and the die thus undergo substantial strain and, in the absence of an expedient to reduce such strain, the cumulative strain often leads to solder joint failure.

Typically, a material denominated an underfill composition is introduced between the die and the substrate so that it surrounds and physically but not electrically interconnects the mating solder bumps. Thus, as shown in FIG. 3, the die, 31, and the substrate, 32, are connected by solder bumps, 33. Underfill material, 34, surrounds the solder bumps and produces a physical communication between the substrate and the die. Generally, the underfill material is chosen to be relatively rigid, i.e. has an elastic modulus at room temperature of at least 2 MPa. The rigidity of the underfill material in essence produces a monolithic structure encompassing the die and the substrate and accordingly significantly reduces the stress on the mating solder bumps. In the presence of a rigid underfill material the mismatch induced stresses and strains on the solder bumps are reduced. As a result, solder bump failure is substantially mitigated for many devices. Nevertheless as the size of the die increases, the strain on the mating solder bumps, and especially the outermost periphery of such bumps, also increases as does the interfacial strain between the underfill and the die. As solder bump grid arrays with pitches less than 230 $\mu$m and with dies with largest dimensions greater than 15 mm are contemplated, the challenge for underfill materials has become difficult to meet. In particular, the extremely stiff materials required to preserve solder bump integrity are capable of causing the die itself to fracture or causing irreparable damage to the substrate itself as the substrate expands.

For next generation devices with dies having at least one of its dimensions 15 mm or more and thus typically having in excess of 3500 solder bumps between the substrate and the die with a pitch generally smaller than 230 $\mu$m, the stress generated is substantial. (A die has a dimension of 15 mm or more if a side of the smallest rectilinear polygon in which the die can be inscribed is 15 mm or more.) New characteristics for the underfill material are required to meet the demands of this next generation. Yet the characteristics that yield an adequate underfill material are uncertain.

Additionally, the underfill materials are generally polymers such as epoxies that are filled with materials such as glass spheres. The glass spheres are introduced to control the material properties. As solder bump grid arrays become larger and pitches become smaller, the thickness of the underfill materials becomes proportionately smaller. Accordingly, not only are different physical demands placed on underfill materials but the dimensions of the filler particles must also be sized accordingly. However, a change in such size, again, causes a change of the properties of the overall underfill composition. Thus identification of a suitable underfill material for dies having large dimension so that solder bump integrity is maintained without failure of the die itself has become an even more challenging problem. Accordingly, even though a very large number of materials are available for potential use as an underfill (see "Materials for Electronic Packaging—Polymers for Electronic Packaging" in *Electronic Packaging and Interconnection Handbook*, Charles A. Harper, Ed., New York: McGraw-Hill, 2000, pp. 1–57) and even though a plethora of materials are adequate for smaller dies, finding a material adequate for the next generation is a difficult problem.

SUMMARY OF THE INVENTION

Physically stable device packages having large dimension dies (dies with at least one dimension of 15 mm (or greater)) with the number of balls in the grid array between the substrate and die generally exceeding 3500 are producible using underfill materials having specific properties. In particular, the underfill material should have 1) filler particles with major dimension of 15 μm or less, 2) the Elastic modulus at temperatures above $T_g$ (glass transition temperature), should be between about 100 and 300 MPa, and 3) the $T_g$ for the underfill material should be between about 55 degrees C. and 100 degrees C. For solder bumps having a stiffness of 38 GPa or less (such as found for Pb/Sn eutectic solder compositions) the Elastic modulus at temperatures below the $T_g$ of the underfill should be greater than about 2 GPa but less than or equal to 10 GPa, while for solder bumps compositions having a stiffness of 38 GPa and greater, the Elastic modulus at temperatures below $T_g$ should be at least 1.5 times greater than that quoted for solder bumps having characteristics associated with Pb/Sn eutectics. By use of an underfill material having the specified properties in packages employing large dies, the integrity of both the solder bumps and the die are maintained despite the substantial increase in stress produced relative to smaller packages. Suitable materials having the desired properties are the following epoxies with manufacturing identification and location: Sumitomo 4152-R5 Utsunomiya, Japan, Shin Etsu 5125 Tokyo, Japan, Loctite FP4549 Industry, California, USA, Naics 8439-1 Nigata city, Japan, Ablestik RP658-7C Rancho Dominguez, Calif., USA, and Nagase 3423iHX-5 Tatsuno City, Japan; each with a glass particle size distribution of 0.05 to 15 μm in diameter.

DETAILED DESCRIPTION OF THE INVENTION

Figure 1:
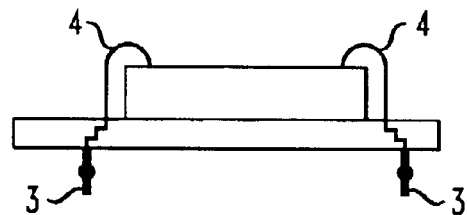
FIG. 1 is illustrative of prior art packaging structures.
Figure 2:
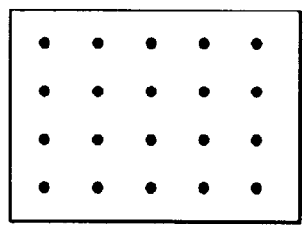
FIG. 2 is illustrative of a ball grid array.
Figure 3:
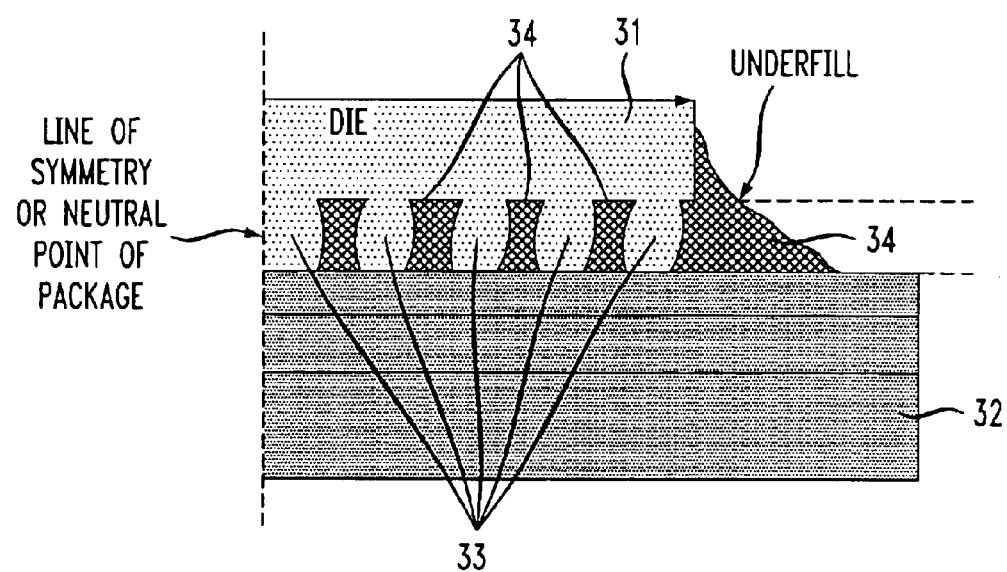
FIG. 3 shows the use of an underfill material.

As discussed, the invention involves a packaged device, such as a flip chip device e.g. an integrated circuit, employing a die with at least one dimension greater than 15 mm and employing an underfill material with appropriate Elastic moduli above and below the glass transition temperature of the underfill material. Indeed, devices with dies having an area of 225 mm² or more with an interconnection array, e.g. a solder bump array containing 3500 or more interconnections, are possible. The cured underfill composition should have a Elastic modulus below its $T_g$ in the range from 2 GPa to 10 GPa. The Elastic modulus of the cured underfill material at temperatures above $T_g$ should be from 100 to 300 MPa for solder bump material having a stiffness at room temperature below 38 GPa. Similarly for solder bump compositions having a stiffness at room temperature greater than 38 GPa (as encountered for non lead containing solders such as SnAgCu, SnAg, and SnCu) the same characteristics are appropriate except the Elastic modulus below $T_g$ should be at least 1.5 times that specified as suitable in conjunction with solders that tolerate greater distortion, e.g. lead eutectic solders. Additionally the $T_g$ of the composition should be in the range from about 55° C. to 110° C. A $T_g$ below 55° C. is undesirable because the interconnection region will be subject to excessive stress while a $T_g$ above 110° C. is generally not desirable because the stress on the die, the underfill/die interface, and substrate portion of the package is unacceptably high.

The filler material such as glass spheres or ceramic particles, e.g. aluminum oxide particles, used as a constituent of the underfill material should have an average diameter less than 15 μm. (Diameter as used in this context is the diameter of a sphere having the same volume as the particle of the filler material. Thus, spherical particles are not required but suitable dimensions are quantified in terms of a sphere with equivalent volume to that of the actual particle.) The composition of the glass filler material is not critical but the overall underfill composition including such filler material should be as specified previously. Typical filler materials include silica or ceramic. Generally, filler material diameters vary from 0.05 μm to 25 μm. Diameters greater than 15 μm are not easily accommodated in the package while diameters less than 0.05 μm are often undesirable due to increased viscosities in the dispensed material.

Although the invention relies on the Elastic moduli for the underfill material, both above and below $T_g$, other properties, although not essential to the invention, make fabrication of a package more convenient. Generally, the cure temperature of the underfill material should be less than 150° C. Higher cure temperatures required in processing the package leads to degradation of other organic materials in the package and increased stress on the assembly. Similarly, the underfill material should be dispensable between the substrate and the die at temperatures in the range 25° C. to 110° C. Temperatures above 110° C. are inconvenient for such dispensing while temperatures below 25° C. are generally not desirable because they require cooling the assembly. The underfill material should have a viscosity in the range 50 cps to 800 cps at the dispensing temperature, and should not undergo any substantial degradation at temperatures below 240° C. Generally to form the package the substrate and the die are bonded by a process such as solder reflow as described in "Solder-Bumped Flip Chip Interconnect Technologies" in *Flip-Chip Technologies*, John H. Lau, NY, McGraw-Hill, 1995, pp 123–153, which is hereby incorporated by reference. The underfill material is then introduced between the die and substrate by capillary action. Accordingly, cure and dispensing temperatures, as well as thermal stability in the range indicated expedites such process.

Desirable coefficients of thermal expansion for the cured underfill material also depends on the particular solder materials employed. Generally solder materials with stiffness at room temperature below 38 GPa the coefficient of thermal expansion at temperatures above $T_g$ should be less than 115 ppm/° C. while for solder materials with stiffness above room temperature above 38 GPa the coefficient of thermal expansion at temperatures above $T_g$ should be less than 90 ppm/C. Typically, it is desirable to avoid coefficients of thermal expansion greater than those specified because of increased stress/strain on the substrate, chip and interconnect region. Additionally, the coefficient of thermal expansion at temperatures below $T_g$ irrespective of solder material should be in the range 15 to 40 ppm/° C. Coefficients less than 15 ppm/° C. or above 40 ppm/° C. lead to higher stress on the solder bumps and/or other portions of the package.

Typical of compositions employed for underfill include filled epoxy mixtures and filled thermoplastic polymers. The composition and dimensions of the filler material in the underfill material are as described previously. Exemplary of polymer materials that are formulated with the filler material are silica filled, amine cured bisphenol A epoxies such as Sumitomo 4152-R5, Shin Etsu 5125, Loctite FP4549, Naics 8439-1, Ablestik RP658-7C, and Nagase 3423iHX-5. The relative weight percentage of polymer to filler should be in the range 35 to 65. Percentages below 35 are undesirable because the modulus is too low and the coefficient of thermal expansion is too high while percentages above 65 should generally be avoided due to an excessively high modulus, a coefficient of thermal expansion that is too low, and increased difficulty in material processing. Other additives are optionally useful in the underfill material. Such additives include rubber modifiers, pigments and or dyes, reactive diluents and coupling agents (adhesion promoters). The materials employed in the underfill material are generally combined by mechanical mixing and introduced between the die and substrate by 1) application of the substrate and/or die before bonding, 2) injection molding, or 3) by capillary action between the die and substrate at temperatures typically in the range 23 degrees C. and 110 degrees C. Temperatures for capillary action insertion are chosen in accordance with processing exigencies. Generally, higher temperatures are employed when the path the injected material must follow presents a relatively high resistance and/or when more rapid injection is desired. Lower temperatures, however, are more economic and are easier to employ.

We claim:

1. A packaged electronic device comprising 1) a die having a dimension of 15 mm or greater and including an array of connections, 2) a substrate including a mating array physically and electrically interconnected with said array of the die and external electrical connections, and 3) an underfill material between said die and said substrate in the region of said arrays wherein said underfill material has A) an elastic modulus at temperatures above the glass transition temperature, $T_g$, of said underfill material between about 100 and 300 MPa, B) a $T_g$ between about 55° C. to 110° C., and C) an elastic modulus at temperatures below the $T_g$ of said underfill material between about 2 GPa and 10 GPa where said array of said substrate has a stiffness less than 38 GPa and about 3 GPa to 15 GPa where said array of said substrate has a stiffness of 38 GPa and greater, and wherein said underfill material includes filler particles with average diameter of 15 $\mu$m or less.

2. The device of claim 1 wherein said underfill material comprises an epoxy.

3. The device of claim 2 wherein said epoxy comprises an amine cured bisphenol A epoxy.

4. The device of claim 1 wherein said underfill material has a coefficient of thermal expansion in the range of 15 to 40 ppm/° C.

5. The device of claim 1 wherein said filler particles comprise glass particles.

6. The device of claim 1 wherein said filler particles comprise aluminum oxide.

7. The device of claim 1 wherein said array of said substrate comprises at least 3500 balls.

8. The device of claim 7 wherein said balls comprise a lead eutectic.

9. The device of claim 7 wherein said balls comprise a lead free solder.

10. A packaged electronic device comprising 1) a die having an area of 225 mm² or greater and including an array of connections, 2) a substrate including a mating array physically and electrically interconnected with said array of the die and external electrical connections, and 3) an underfill material between said die and said substrate in the region of said arrays wherein said underfill material has A) an elastic modulus at temperatures above the glass transition temperature, $T_g$, of said underfill material between about 100 and 300 MPa, B) a $T_g$ between about 55° C. to 110° C., and C) an elastic modulus at temperatures below the $T_g$ of said underfill material between about 2 GPa and 10 GPa where said array of said substrate has a stiffness less than 38 GPa and about 3 GPa to 15 GPa where said array of said substrate has a stiffness of 38 GPa and greater, and wherein said underfill material includes filler particles with average diameter of 15 $\mu$m or less.

11. The device of claim 10 wherein said underfill material comprises an epoxy.

12. The device of claim 11 wherein said epoxy comprises an amine cured bisphenol A epoxy.

13. The device of claim 10 wherein said underfill material has a coefficient of thermal expansion in the range of 15 to 40 ppm/° C.

14. The device of claim 10 wherein said filler particles comprise glass particles.

15. The device of claim 10 wherein said filler particles comprise aluminum oxide.

16. The device of claim 10 wherein said array of said substrate comprises at least 3500 balls.

17. The device of claim 16 wherein said balls comprise a lead eutectic.

18. The device of claim 16 wherein said balls comprise a lead free solder.

19. A packaged integrated circuit comprising 1) a die having a dimension of 15 mm or greater and including an array of connections, 2) a substrate including a mating array physically and electrically interconnected with said array of the die and external electrical connections, and 3) an underfill material between said die and said substrate in the region of said arrays wherein said underfill material has A) an elastic modulus at temperatures above the glass transition temperature, $T_g$, of said underfill material between about 100 and 300 MPa, B) a $T_g$ between about 55° C. to 10° C., and C) an elastic modulus at temperatures below the $T_g$ of said underfill material between about 2 GPa and 10 GPa where said array of said substrate has a stiffness less than 38 GPa and about 3 GPa to 15 GPa where said array of said substrate has a stiffness of 38 GPa and greater, and wherein said underfill material includes filler particles with average diameter of 15 $\mu$m or less.

20. A packaged integrated circuit device comprising 1) a die having an area of 225 mm² or more and including an array of connections, 2) a substrate including a mating array physically and electrically interconnected with said array of the die and external electrical connections, and 3) an underfill material between said die and said substrate in the region of said arrays wherein said underfill material has A) an elastic modulus at temperatures above the glass transition temperature, $T_g$, of said underfill material between about 100 and 300 MPa, B) a $T_g$ between about 55° C. to 110° C., and C) an elastic modulus at temperatures below the $T_g$ of said underfill material between about 2 GPa and 10 GPa where said array of said substrate has a stiffness less than 38 GPa and about 3 GPa to 15 GPa where said array of said substrate has a stiffness of 38 GPa and greater, and wherein said underfill material includes filter particles with average diameter of 15 $\mu$m or less.

* * * * *